United States Patent [19]

Hayashi et al.

[11] Patent Number: 5,075,746
[45] Date of Patent: Dec. 24, 1991

[54] THIN FILM FIELD EFFECT TRANSISTOR AND A METHOD OF MANUFACTURING THE SAME

[75] Inventors: Yutaka Hayashi; Mitsuyuki Yamanaka, both of Taukuba; Takashi Yoshimi, Tokyo, all of Japan

[73] Assignees: Agency of Industrial Science and Technology; Taiyo Yuden Co., Ltd., both of Tokyo, Japan

[21] Appl. No.: 380,640

[22] Filed: Jul. 14, 1989

[30] Foreign Application Priority Data

Jul. 19, 1988 [JP] Japan .................. 63-180575

[51] Int. Cl.⁵ .............. H01L 27/01; H01L 27/12; H01L 29/48
[52] U.S. Cl. ........................ 357/23.7; 357/4; 357/15
[58] Field of Search ............. 357/4, 23.7, 15, 30, 357/2, 58

[56] References Cited

U.S. PATENT DOCUMENTS

| 4,679,062 | 7/1987 | Okamoto | 357/22 |
| 4,907,040 | 3/1990 | Kobayashi et al. | 357/4 |
| 4,942,441 | 7/1990 | Konishi et al. | 357/23.7 |

FOREIGN PATENT DOCUMENTS

| 0007312 | 2/1981 | Japan | 357/23 |
| 60-53082 | 3/1985 | Japan | 357/4 |
| 60-98680 | 6/1985 | Japan | 357/23.4 |
| 60-113971 | 6/1985 | Japan | 357/4 |
| 61-150278 | 7/1986 | Japan | 357/4 |
| 61-214476 | 9/1986 | Japan | 357/4 |
| 62-113476 | 5/1987 | Japan | 357/4 |
| 62-120076 | 6/1987 | Japan | 357/4 |
| 62-209862 | 9/1987 | Japan | 357/23.7 |
| 63-47979 | 2/1988 | Japan | 357/23.7 |

Primary Examiner—Andrew J. James
Assistant Examiner—Donald L. Monin
Attorney, Agent, or Firm—Flynn, Thiel, Boutell & Tanis

[57] ABSTRACT

A thin film field effect transistor comprising a source electrode and a drain electrode joined to a first semiconductor layer respectively through first and second portions of a second doped semiconductor layer, a gate insulating layer, and a gate electrode capacity-coupled through the gate insulating layer with a portion of the first semiconductor layer, in which a channel is formed, corresponding to a gap between the source electrode and the drain electrode. A doped intermediate semiconductor layer is formed in contact with the channel in the first semiconductor layer. The gate threshold voltage of the thin film field effect transistor can be varied by selectively varying the thickness of the doped intermediate semiconductor layer. Thus, a plurality of thin film field effect transistors respectively having different gate threshold voltages can be formed on a single substrate simply by forming the doped intermediate semiconductor layers for the thin film field effect transistors with different thicknesses.

12 Claims, 16 Drawing Sheets $dI_d/dV_d - V_g$ characteristics

Thickness of $n^+ \alpha$-Si:H on channel

THIN FILM FIELD EFFECT TRANSISTOR AND A METHOD OF MANUFACTURING THE SAME

BACKGROUND OF THE INVENTION

1. Field of the Invention

The present invention relates to a thin film field effect transistor (hereinafter referred to as "thin film FET") and a method of manufacturing the same and, more specifically, to an insulated gate FET having a gate electrode capacity-coupled with a semiconductor channel through an insulating layer or a junction-gate FET having a gate making a rectifying junction with a semiconductor channel layer, and a method of manufacturing such a FET.

2. Description of the Prior Art

The construction of a thin film conventional insulated gate field effect transistor (hereinafter referred to as "insulated gate FET") will be described with reference to FIGS. 36, and 37. In an thin film insulated gate field effect transistor, a source electrode 6 and a drain electrode 7 are joined respectively through second thin semiconductor layers 5a and 5b, namely, doped thin film semiconductor layers, to a first semiconductor layer 4. A gate electrode 2 is capacity-coupled through a gate insulating layer 3 with a channel 8 in the first semiconductor layer 4 between the source electrode 6 and the drain electrode 7.

FIG. 36 shows a thin film insulated gate FET having a gate electrode 2 formed on a substrate 1. This insulated gate FET comprises a substrate 1, a gate electrode 2 formed on the substrate 1, a gate insulating layer 3 covering the gate electrode 2, a first semiconductor layer 4, i.e., a thin silicon film, formed over the gate insulating layer 3, spaced apart second semiconductor layers 5a and 5b, i.e., doped thin silicon films, formed over the first semiconductor layer 4, a source electrode 6 (metal film) formed over the spaced apart second semiconductor layer 5a, and a drain electrode 7 (metal film) formed over the spaced apart second semiconductor layer 5b. A gap between the source electrode 6 and the drain electrode 7 is formed opposite to the gate electrode 2 and a portion of the first semiconductor layer 4 corresponding to the gap is a channel 8.

FIG. 37 shows a thin film insulated gate FET having electrodes, an insulator and semiconductor layers similar to those of the insulated gate FET of FIG. 38, except that the electrodes and semiconductor layers are formed in the reverse order on a substrate. That is, this thin film insulated gate FET comprises a substrate 1, a conductive source electrode 6 formed on the substrate 1, a conductive drain electrode 7 formed on the substrate 1, spaced apart second semiconductor layers [doped semiconductor layers] 5a and 5b formed respectively on the source electrode 6 and the drain electrode 7, a first semiconductor layer 4 formed on the spaced apart second semiconductor layers 5a and 5b and on the substrate 1, an insulating layer 3 formed on the first semiconductor layer 4, and a conductive gate electrode 2 formed on the insulating layer 3. A portion of the first spaced apart layer 4 corresponding to a gap between the spaced apart second semiconductor layers 5a and 5b is a channel 8.

The gate threshold voltage $V_{th}$ of such a thin film FET is dependent on the work function of the conductive material forming the gate electrode 2, the charge density and thickness of the gate insulating layer 3, and the effective charged state density $N_E$ and thickness of the first semiconductor layer 4.

In constructing an electronic circuit on a substrate by forming thin semiconductor films over the substrate by a plasma CVD process or a molecular beam epitaxy process, transistors respectively having similar film constructions are formed simultaneously on the substrate under the same film forming conditions deciding the foregoing parameters. Accordingly, the transistors have nearly the same gate threshold voltage $V_{th}$.

In most cases, it is required to set a predetermined gate threshold voltage $V_{th}$ accurately for such a thin film FET in accordance with the purpose of the associated electronic circuit. On the other hand, since changing the material constituting the films and the film forming process or film forming conditions are the only means of adjusting the gate threshold voltage $V_{th}$, the foregoing manufacturing conditions must be changed to construct FETs respectively having different gate threshold voltages. However, from the viewpoint of process management, it is undesirable to change the manufacturing conditions and, in view of productivity, it is desirable to keep the manufacturing conditions for the FETs with different $V_{th}$'s as similar as possible. Furthermore, even if the manufacturing conditions could be changed, practically it is quite hard to control optionally the work function of the conductive material for forming the gate electrode 2, the charge density of the gate insulating layer 3 and the effective charged state density $N_E$ of the first semiconductor layer 4 in which the channel 8 is formed. Thus, the accurate regulation of the gate threshold voltage $V_{th}$ has been very difficult.

In some cases, it is required to form a plurality of thin film FETs respectively having different gate threshold voltages on a single substrate. However, it is impossible to meet such a requirement, when the thin film FETs are formed on the same substrate by using the same materials and under the same film forming conditions.

SUMMARY OF THE INVENTION

Accordingly, it is a first object of the present invention to provide a thin film FET capable of solving the foregoing problems.

It is a second object of the present invention to provide a thin film FET manufacturing method capable of readily manufacturing a thin film FET capable of solving the foregoing problems.

In one aspect of the present invention, a thin film FET comprises: a source electrode 6 and a drain electrode 7 joined to a first semiconductor layer 4 respectively through the spaced apart second semiconductor layers 5a, 5b formed of a doped semiconductor film; and a gate electrode 2 capacity-coupled through a gate insulating layer 3 with a portion of the first semiconductor layer, in which a channel 8 is formed, corresponding to a gap between the source electrode 6 and the drain electrode 7; in which a doped intermediate semiconductor layer 9 is formed in contact with the channel 8 in the first semiconductor layer 4.

In a second aspect of the present invention a thin film FET comprises: a source electrode 6 and a drain electrode 7 joined to a first semiconductor layer 4 respectively through spaced apart second semiconductor layers 5a, 5b; and a gate layer 2 joined to a first surface of a portion of the first semiconductor layer 4, which corresponds to a gap between the source electrode 6 and the drain electrode 7 in which a channel 8 is formed, by an insulating layer 3 and forms a barrier between the gate electrode 2 and the channel 8; in which a doped intermediate semiconductor layer 9 is formed in contact with the channel 8 in the first semiconductor layer.

In a third aspect of the present invention, a thin film FET manufacturing method comprises: sequentially forming a gate electrode, a gate insulating layer, a first semiconductor layer 4 and a second semiconductor layer 5 in that order on a substrate 1 by thin film forming means; and separately forming a source electrode 6 and a drain electrode 7 on the layered structure of the gate electrode, the gate insulating layer 3, the first semiconductor layer 4 and the second semiconductor layer 5, in which an inner portion of the second semiconductor layer 5 provided between spaced apart outer portions of the second semiconductor layer 5a, 5b, respectively provided under the source electrode 6 and the drain electrode 7, and corresponding to a gap between the source electrode 6 and the drain electrode 7, is left unprocessed or partly etched or oxidized to form an intermediate semiconductor layer.

In a fourth aspect of the present invention, a thin film FET manufacturing method comprises: sequentially forming a gate layer 2, a first semiconductor layer 4 and a second semiconductor layer 5 in that order on a substrate 1; and separately forming a source electrode 6 and a drain electrode 7 on the layered structure of the gate layer 2, the first semiconductor layer 4 and the second semiconductor layer 5; in which an inner portion of the second semiconductor layer 5 provided between spaced apart outer portions of the second semiconductor layer 5a, 5b, respectively provided under the source electrode 6 and the drain electrode 7, and corresponding to a gap between the source electode 6 and the drain electrode 7, is left unprocessed or partly etched or oxidized to form an intermediate semiconductor layer 9.

In a fifth aspect of the present invention, the inner portion of the second semiconductor layer 5 between the spaced apart outer portions of the second semiconductor layer 5a, 5b, which are adjacent the source electrode 6 and the drain electrode 7, is removed to form a gap and a third semiconductor layer 10 is formed in the gap, and an intermediate semiconductor layer 9 is formed in at least a portion of the third semiconductor layer 10.

In a sixth aspect of the present invention, a thin film FET manufacturing method comprises: forming a doped second semiconductor layer 5 by thin film forming, means on a source electrode 6 and a drain electrode 7 which are separated from each other; and forming a first semiconductor layer 4, a gate insulating layer 3 and a gate electrode 2 over the second semiconductor layer 5; in which a portion of the second semiconductor layer 5 between spaced apart portions of the second semiconductor layer 5a, 5b, which are in contact respectively with the source electrode 6 and the drain electrode 7, is left unprocessed or partly etched or oxidized to form an intermediate semiconductor layer 9, and the first semiconductor layer 4 and the gate electrode 2 are formed on the intermediate semiconductor layer 9.

In a seventh aspect of the present invention, a thin film FET manufacturing method comprises: forming a doped second semiconductor layer 5 by thin film forming means, on a source electrode 6 and a drain electrode 7 which are separated from each other; and forming, a first semiconductor layer 4 and a gate layer 2 on the second semiconductor layer 5; in which an inner portion of the second semiconductor layer 5 between spaced apart portions of second semiconductor layers 5a, 5b which are in contact respectively with the source electrode 6 and the drain electrode 7, is left unprocessed or is partly etched or oxidized to form an intermediate semiconductor layer 9, and the first semiconductor layer 4 and a gate electrode 2 are formed on the intermediate semiconductor layer 9.

In an eighth aspect of the present invention, an inner portion of the second semiconductor layer 5 between the spaced apart second semiconductor layer 5a, 5b, which respectively are in contact with the source electrode 6 and the drain electrode 7, is removed to form a gap and a third semiconductor layer 10 is formed in the gap, and an intermediate semiconductor layer 9 is formed in at least a portion of the third semiconductor layer 10.

In a ninth aspect of the present invention, the source electrode 6 and the drain electrode 7 are formed separately after forming the doped third semiconductor layer 10, the spaced apart portions of the second semiconductor layer 5a, 5b of the second semiconductor layer 5 are formed respectively on the source electrode 6 and the drain electrode, the first semiconductor layer 4 and the gate electrode 2 are formed on the electrodes 6, 7, and the intermediate semiconductor layer 9 is formed in a portion of the third semiconductor layer 10 in contact with the first semiconductor layer 4.

The spaced apart portions of the second semiconductor layer 5a, 5b are formed between the source electrode 6 and the first semiconductor layer 4 and between the drain electrode 7 and the first semiconductor layer 4 for the ohmic contact of the source electrode 6 and the drain electrode 7 with the first semiconductor layer 4. The inventors of the present invention found that the gate threshold voltage $V_{th}$ can be increased or decreased by leaving a portion of the second semiconductor layer 5 between the spaced apart portions of the second semiconductor layer 5a, 5b in the channel 8 between the source electrode 6 and the drain electrode 7 or by forming a doped third semiconductor film, i.e., an intermediate semiconductor layer 9, on a portion of the first semiconductor layer 4 between the spaced apart portions of the second semiconductor layer 5a, 5b and that there is a correlation between the thickness of the intermediate semiconductor layer 9 and the gate threshold voltage $V_{th}$.

Thus, the gate threshold voltage $V_{th}$ of the thin film FET of the present invention can be determined by selectively determining the thickness, impurity concentration, or kind of impurity of the intermediate semiconductor layer 9. The thin film FET manufacturing method of the present invention is able to form easily a plurality of thin film FETs respectively having intermediate semiconductor layers of different thicknesses, impurity concentration, or kind of impurity, and hence, different gate threshold voltages, on a substrate.

The above and other objects, features and advantages of the present invention will become more apparent from the following description taken in conjunction with the accompanying drawings.

DESCRIPTION OF THE PREFERRED EMBODIMENTS

Figure 1:
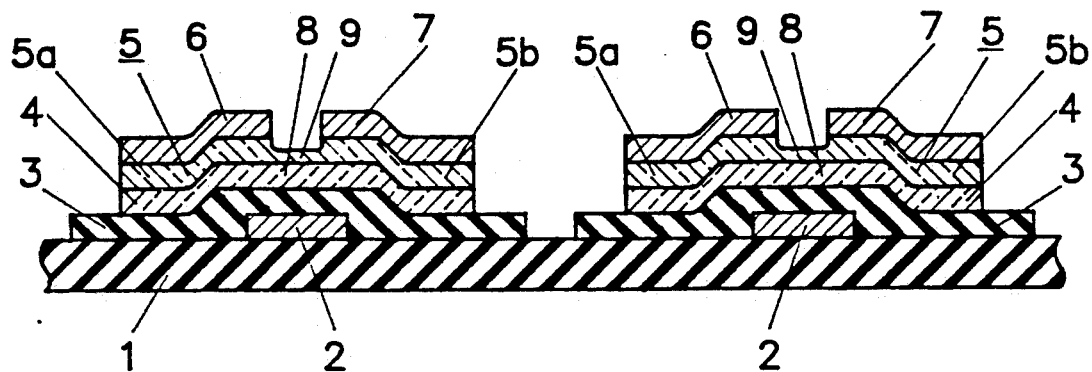
FIGS. 1 to 32 are schematic sectional views showing the structures of thin film FETs embodying the present invention.

First Embodiment (FIG. 1)

FIG. 1 shows two identical thin film FETs embodying the present invention formed on a substrate 1. In each thin film FET, a gate electrode 2 is formed on the substrate 1, a gate insulating layer 3 is formed so as to cover the gate electrode 2, a first semiconductor layer (thin silicon film) 4 is formed over the gate insulating layer 3, a second semiconductor layer (thin silicon film) 5 is formed over the first semiconductor layer 4, and a source electrode 6 and a drain electrode 7 are formed with a gap therebetween on the second semiconductor layer 5. The gap between the source electrode 6 and the drain electrode 7 is positioned directly above the gate electrode 2. A portion of the second semiconductor layer 5 corresponding to the gap is etched partly to form an intermediate semiconductor layer 9. A portion of the second semiconductor layer 5 under the source electrode 6 is a spaced apart second semiconductor layer portion 5a, and a portion of the same under the drain electrode 7 is spaced apart second semiconductor layer portion 5b. A portion of the first semiconductor layer 4 in contact with the intermediate semiconductor layer 9 is a channel 8.

Figure 2:
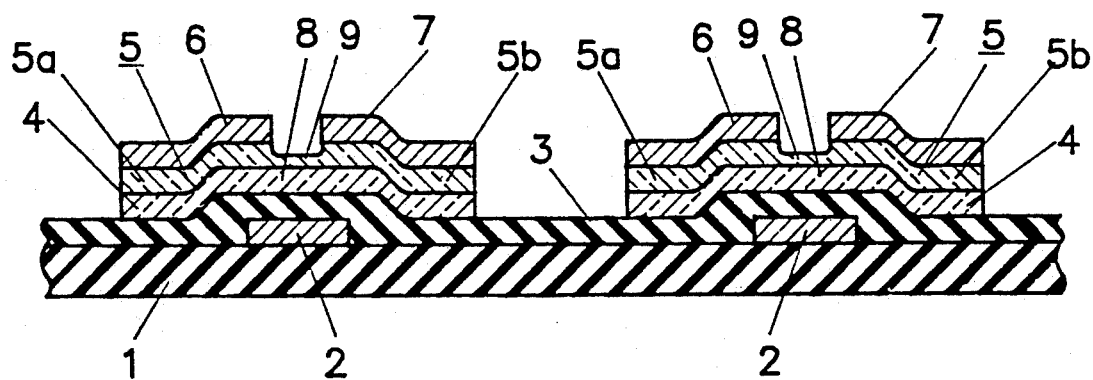

Second Embodiment (FIG. 2)

FIG. 2 shows two identical thin film FETs embodying the present invention formed on a substrate 1. Basically, the thin film FETs in the second embodiment are the same as those shown in FIG. 1. In the second embodiment, gate electrodes 2 are formed on the substrate 1, and a gate insulating layer 3 is formed on the entire surface of the substrate 1 in common to both the thin film FETs so as to cover both the gate electrodes 2.

Figure 3:
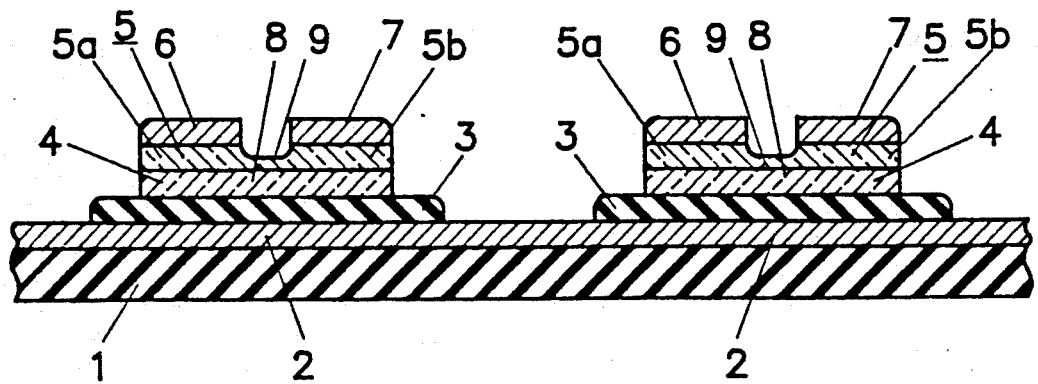

Third Embodiment (FIG. 3)

FIG. 3 shows two identical thin film FETs embodying the present invention formed on a substrate 1. Basically, the thin film FETs in the third embodiment are the same as those shown in FIG. 1. In the third embodiment, a gate electrode 2 is formed on the entire surface of the substrate 1 in common to both the thin film FETs. Although two insulating layers 3 are formed respectively for the two thin film FETs in the third embodiment, an insulating film 3 may be formed on the entire surface of the gate electrode 2 in common to both the thin film FETs.

Figure 4:
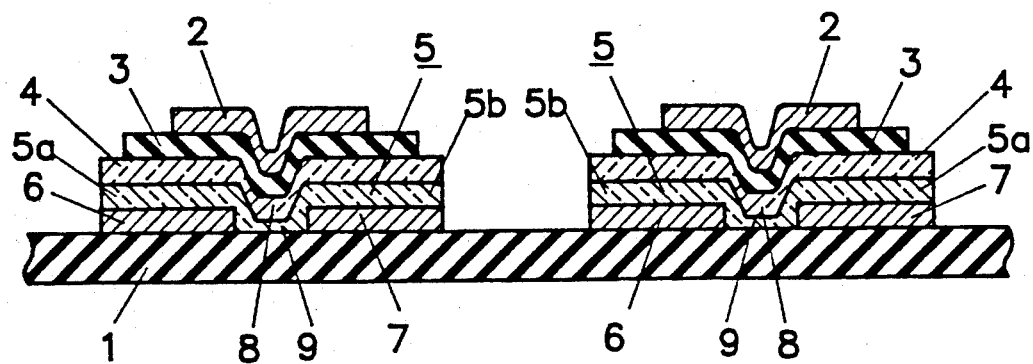

Fourth Embodiment (FIG. 4)

FIG. 4 shows two identical thin film FETs embodying the present invention formed on a substrate 1. In each thin film FET, a source electrode 6 and a drain electrode 7 are formed on the substrate 1 with a gap therebetween, a doped second semiconductor layer 5 is formed on the source electrode 6 and the drain electrode 7. A portion of the second semiconductor layer 5 over the source electrode 6 is spaced apart second semiconductor layer portion 5a, and a portion of the same over the drain electrode 7 is spaced apart second semiconductor layer portion 5b. A portion of the second semiconductor layer 5 corresponding to the gap between the source electrode 6 and the drain electrode 7 is etched partly to form an intermediate semiconductor layer 9. A first semiconductor layer 4, an insulating layer 3 and a gate electrode 2 are formed in that order over the second semiconductor layer 5. The gate electrode 2 is formed above the gap between the source electrode 6 and the drain electrode 7. A portion of the first semiconductor layer 4 corresponding to the gap between the source electrode 6 and the drain electrode 7, namely, a portion of the first semiconductor layer 4 in contact with the intermediate semiconductor layer 9, is a channel 8.

Figure 5:
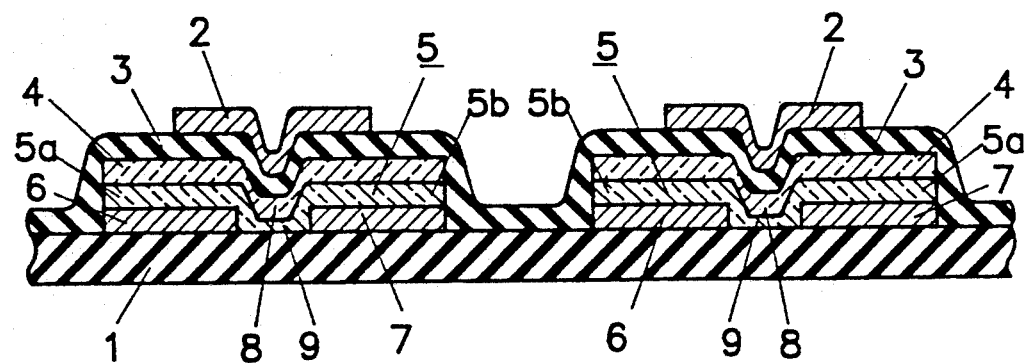

Fifth Embodiment (FIG. 5)

FIG. 5 shows two identical thin film FETs embodying the present invention formed on a substrate 1. Basically, the thin film FETs in the fifth embodiment are the same as those shown in FIG. 4. In the fifth embodiment, a gate insulating layer 3 is formed on the entire surface of the substrate 1 after forming source electrodes 6, drain electrodes 7, first semiconductor layers 4 and a second semiconductor layer 5 respectively for the two thin film FETs to use the gate insulating layer 3 in common to the two thin film FETs.

Figure 6:
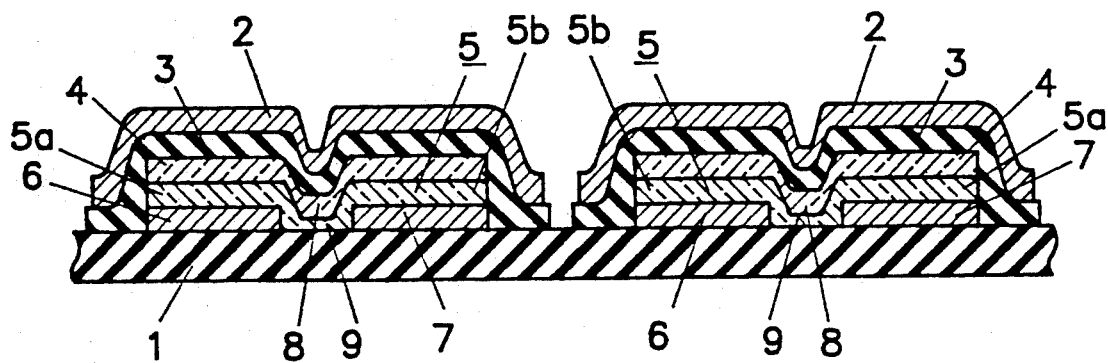
Figure 7:
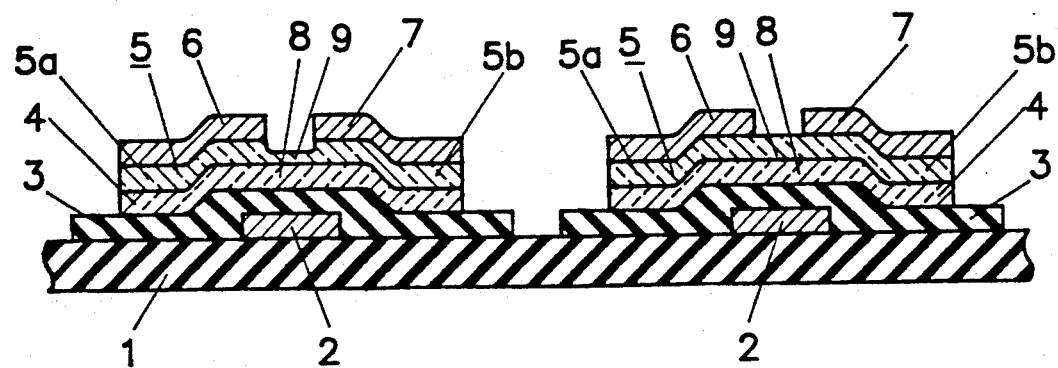
Figure 8:
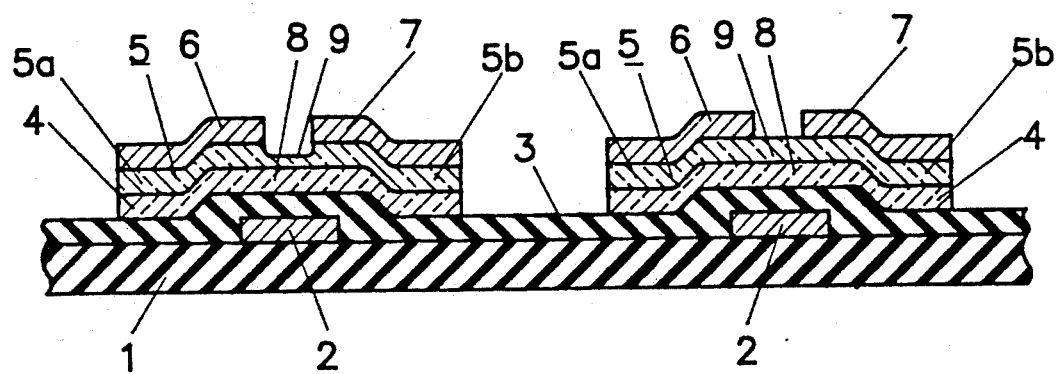
Figure 9:
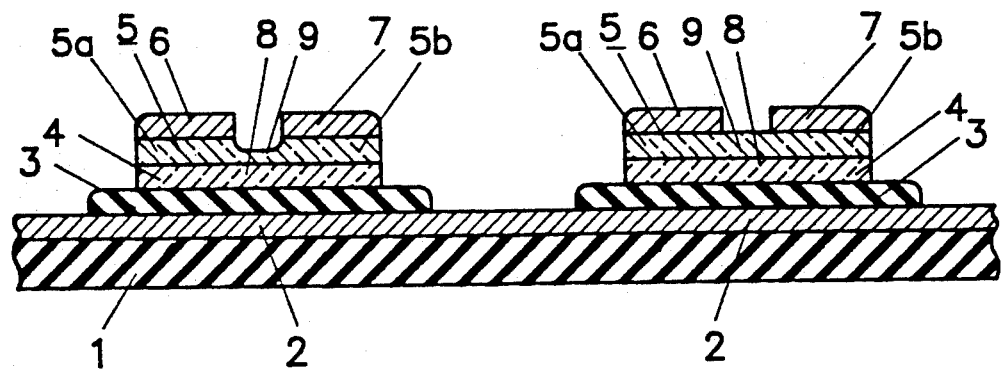
Figure 10:
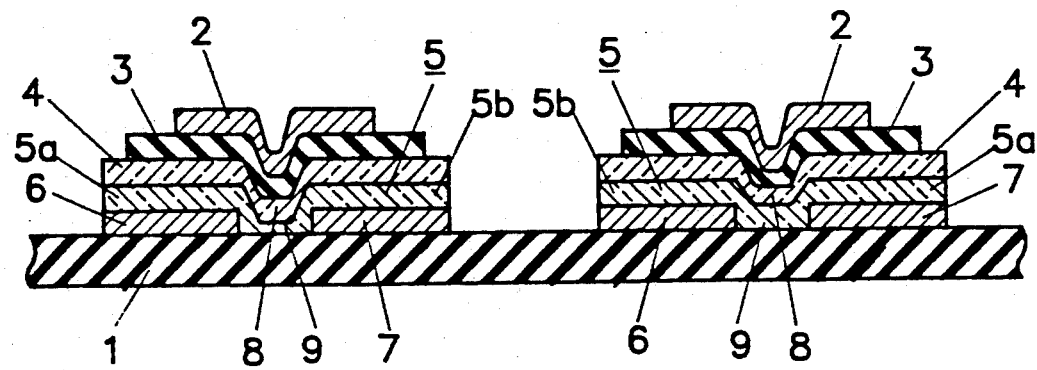
Figure 11:
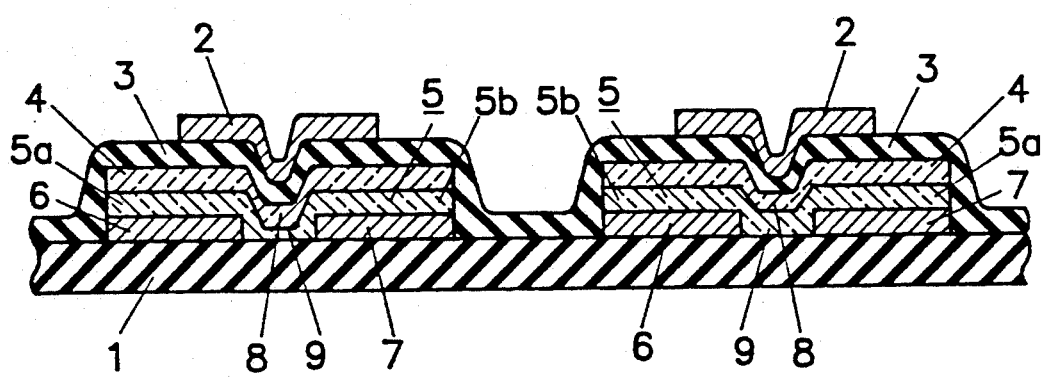
Figure 12:
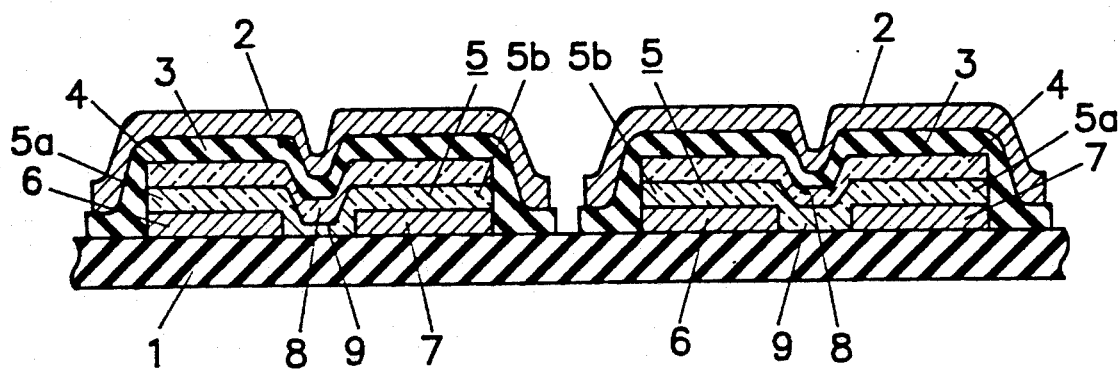

Six Embodiment (FIG. 6)

FIG. 6 shows two identical thin film FETs embodying the present invention formed on a substrate 1. Basically, the thin film FETs in the sixth embodiment are the same as those shown in FIG. 1. In the sixth embodiment, each thin film FET has a wide gate electrode 2 over a gate insulating layer 3 in an area substantially corresponding to a first semiconductor layer 4 and a second semiconductor layer 5 including spaced apart second semiconductor layer portions 5a and 5b.

Seventh to Twelfth Embodiments (FIGS. 7 to 12)

Thin film FETs embodying the present invention shown in FIGS. 7, 8, 9, 10, 11 and 12 are substantially the same in construction as those shown in FIGS. 1, 2, 3, 4, 5 and 6, respectively. In each of FIGS. 7, 8, 9, 10, 11 and 12, two different thin film FETs are shown; the thin film FETs are the same in construction with the exception being that one FET is different from the other in the thickness of the intermediate semiconductor layer 9, so that the thin film FETs are different from each other in gate threshold voltage $V_{th}$.

Figure 13:
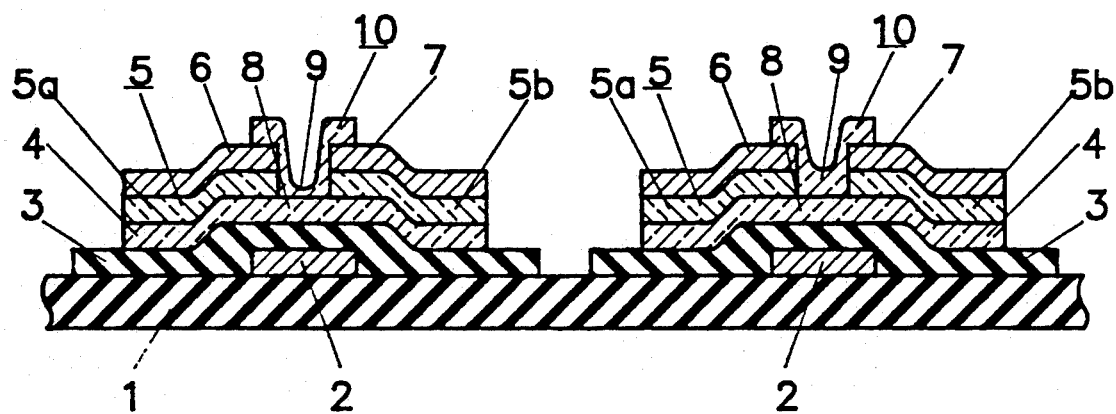

Thirteenth Embodiment (FIG. 13)

FIG. 13 shows two thin film FETs embodying the present invention formed on a substrate 1. Basically, the two thin film FETs are the same in construction. In the thirteenth embodiment, gate electrodes 2 are formed on the substrate 1, source electrodes 6 and drain electrodes 7 are formed in the uppermost layer, a portion of a second semiconductor layer 5 corresponding to a gap between the source electrode 6 and the drain electrode 7 is removed by etching, and a doped third semiconductor layer 10 is formed in a gap formed by removing the portion of the second semiconductor layer 5. A portion of the third semiconductor layer 10 in contact with a channel 8 is an intermediate semiconductor layer 9.

Figure 14:
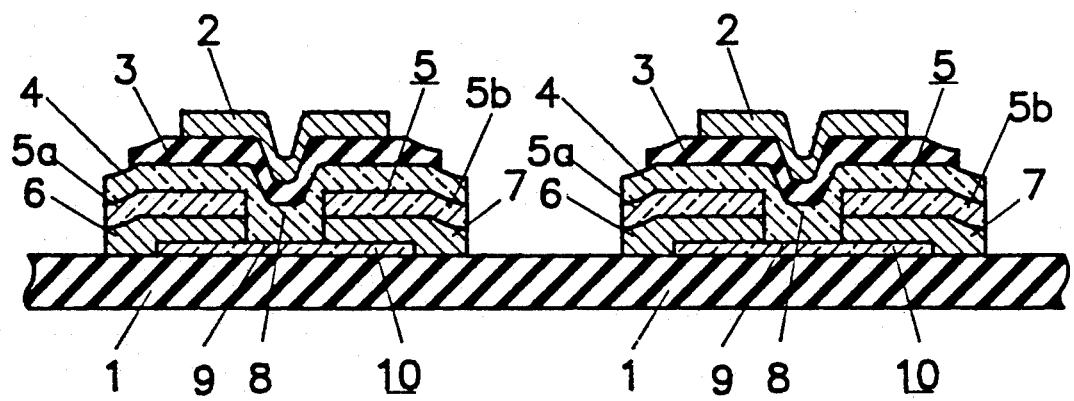

Fourteenth Embodiment (FIG. 14)

FIG. 14 shows two thin film FETs embodying the present invention formed on a substrate 1. Basically, the two thin film FETs are the same in construction. In the fourteenth embodiment, source electrodes 6 and drain electrodes 7 are formed on the substrate 1 and gate electrodes 2 are formed in the uppermost layer. In each thin film FET, a doped third semiconductor layer 10 is formed on the substrate 1, and a portion of the third semiconductor layer 10 in contact with a channel 8 is an intermediate semiconductor layer 9. In this embodiment, the third semiconductor layer 10 can be extended on the substrate 1 and source and drain electrodes 6, 7 can be furnished on the extended third semiconductor layer 10.

Figure 15:
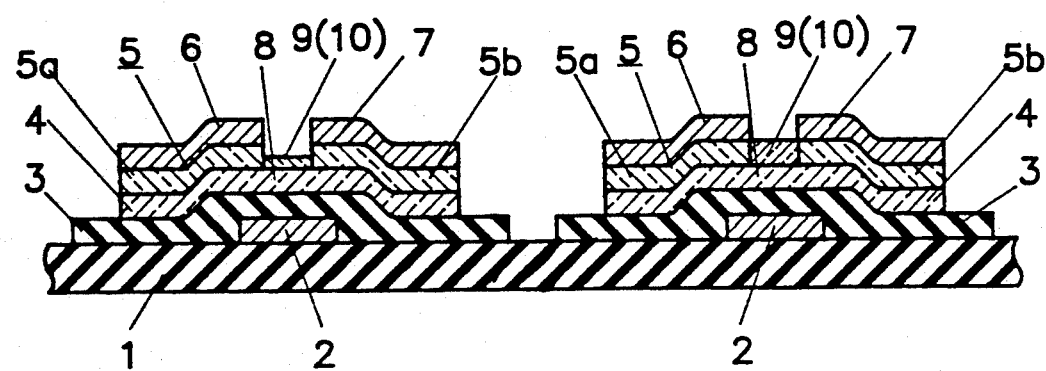

Fifteenth Embodiment (FIG. 15)

FIG. 15 shows two different thin film FETs embodying the present invention formed on a substrate 1. Basically these two thin film FETs are the same in construction as those shown in FIG. 13. In each thin film FET shown in FIG. 15, a portion of a second semiconductor layer 5, corresponding to a gap between a source electrode 6 and drain electrode 7, is removed by etching to form a gap, and a third semiconductor layer 10 serving as an intermediate semiconductor layer 9 is formed in the gap on a first semiconductor layer 4. In the thin film FETs shown in FIG. 15, the thickness of the third semiconductor layer 10 of one thin film FET is greater than that of the other, so that the thin film FETs are different from each other in gate threshold voltage $V_{th}$.

Figure 16:
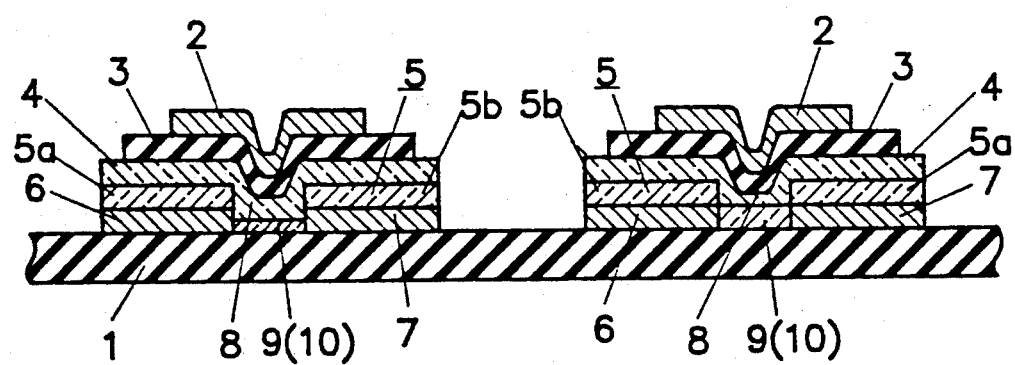
Figure 17:
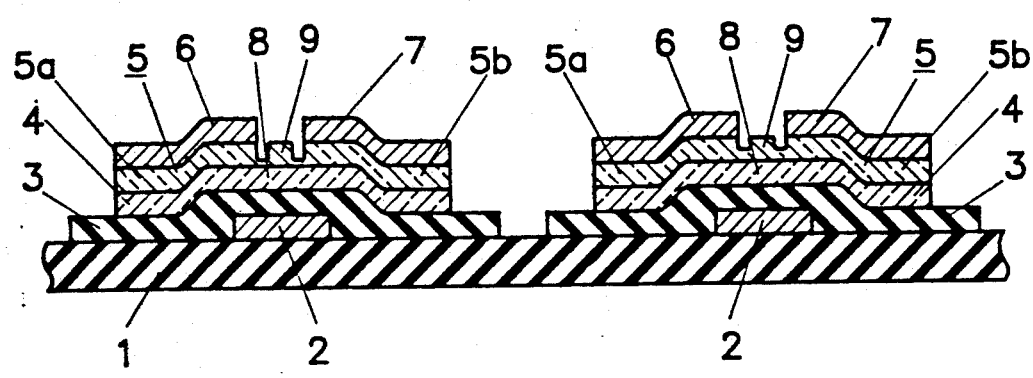
Figure 18:
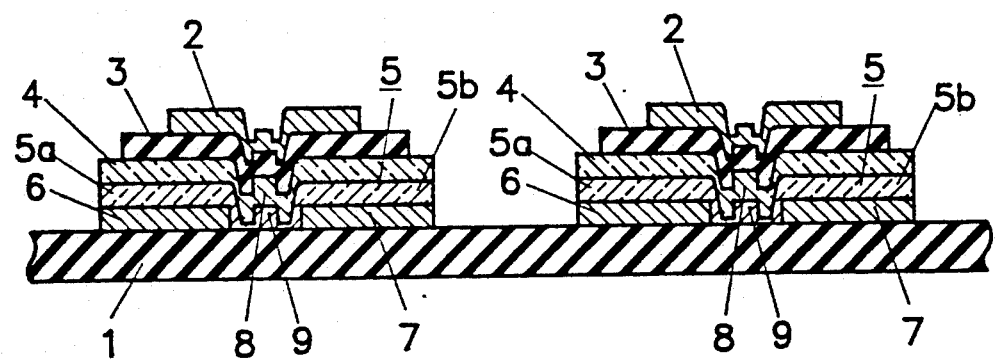
Figure 19:
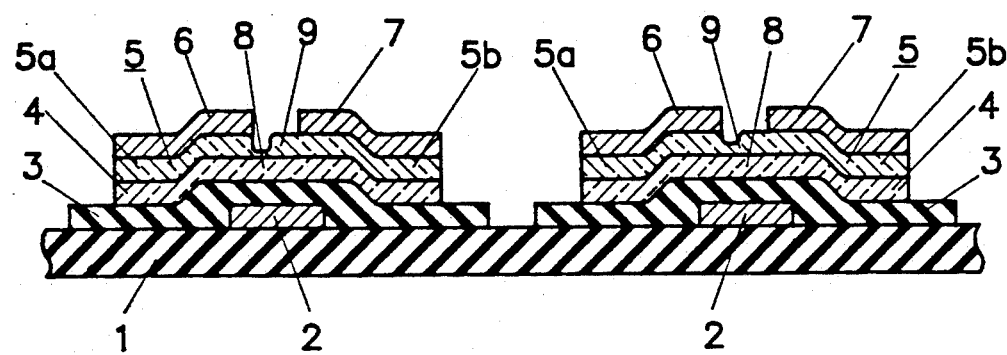
Figure 20:
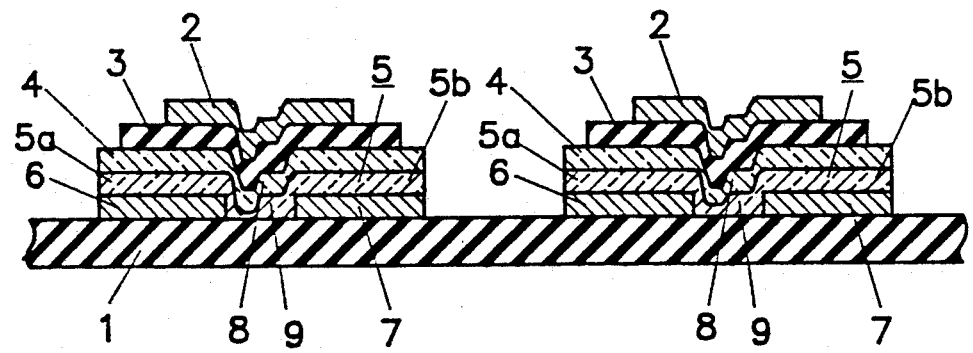
Figure 21:
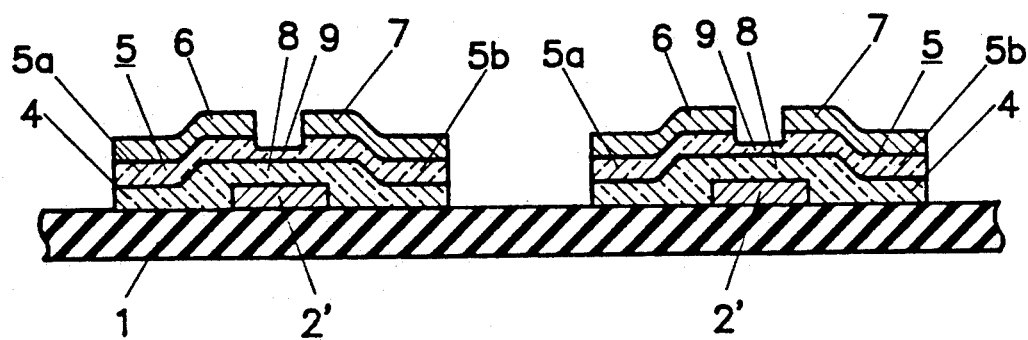
Figure 22:
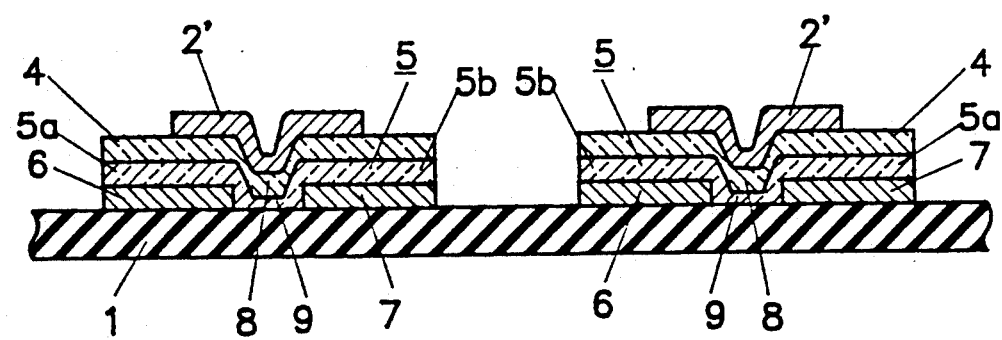
Figure 23:
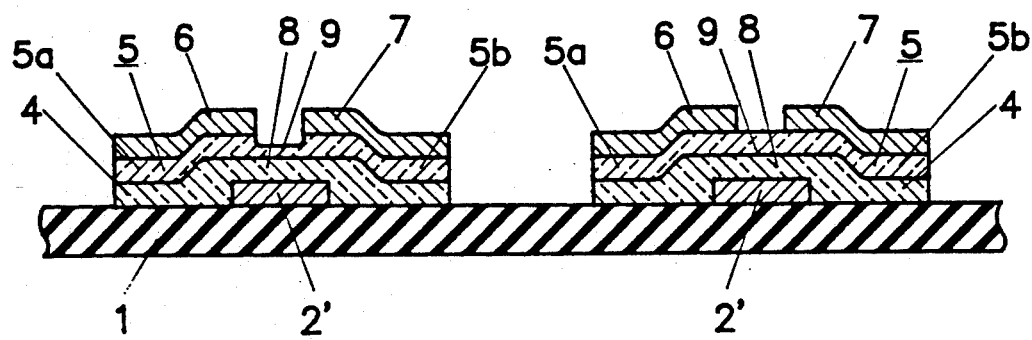
Figure 24:
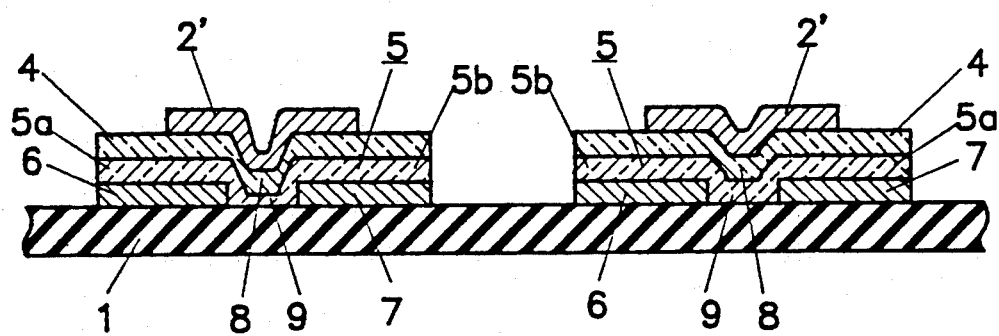
Figure 25:
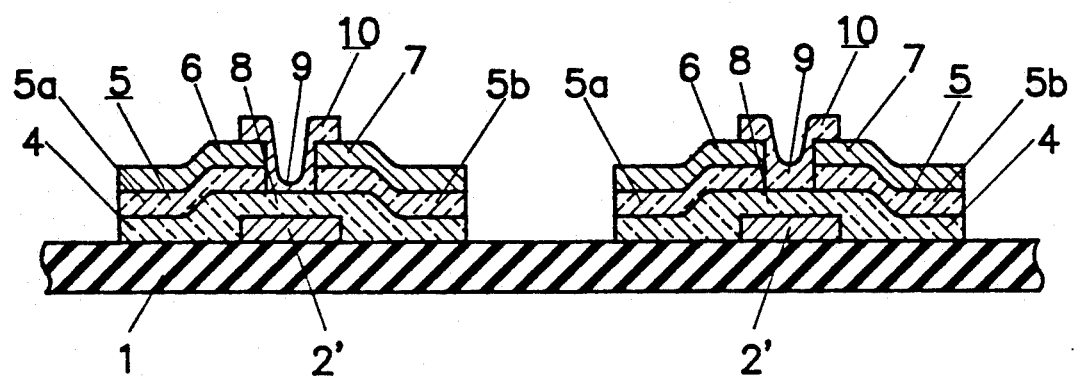
Figure 26:
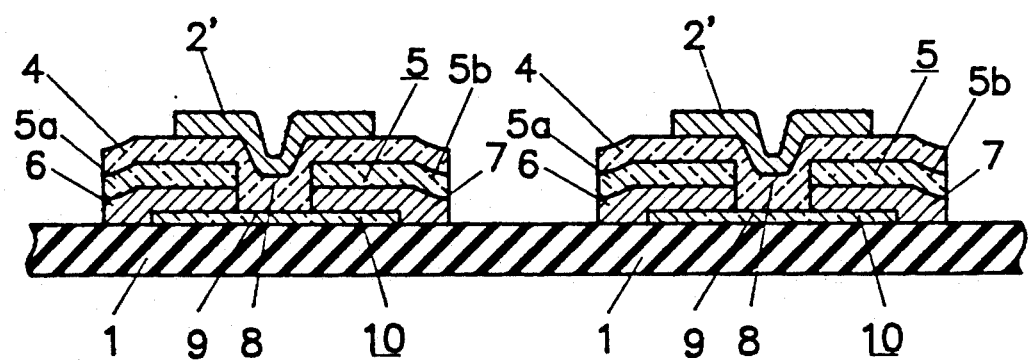
Figure 27:
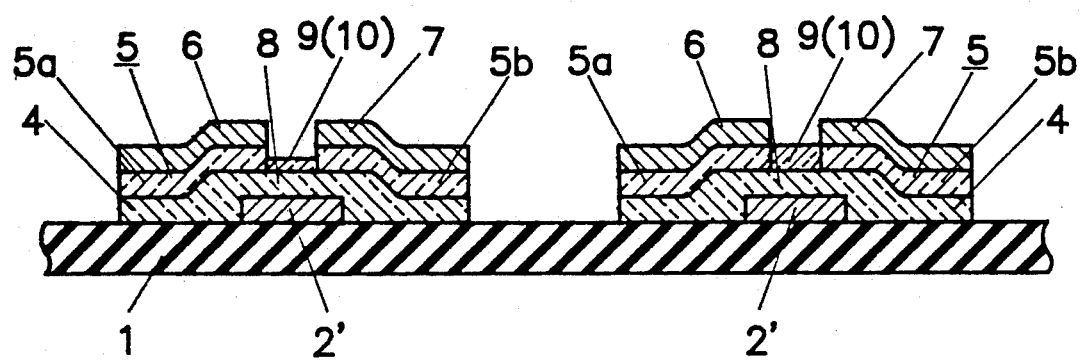
Figure 28:
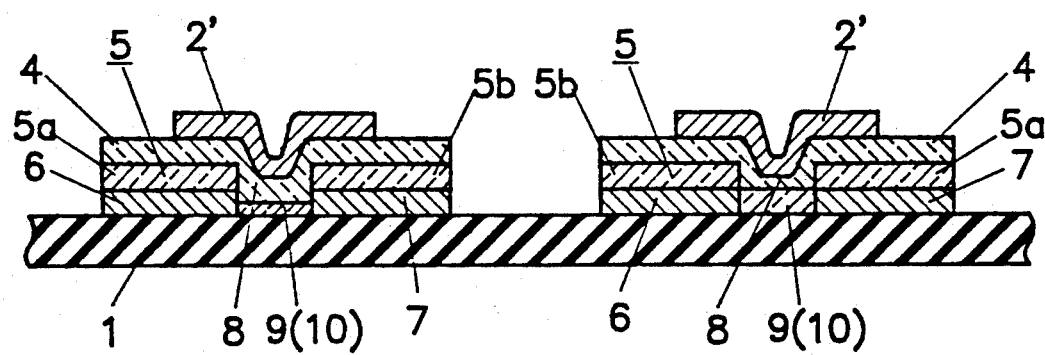
Figure 29:
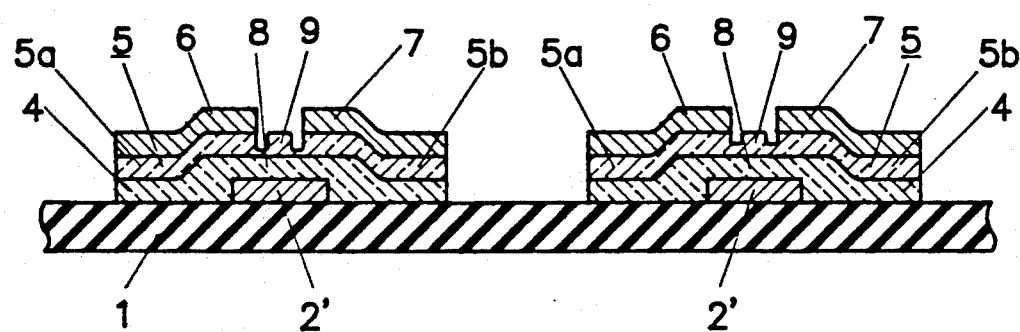
Figure 30:
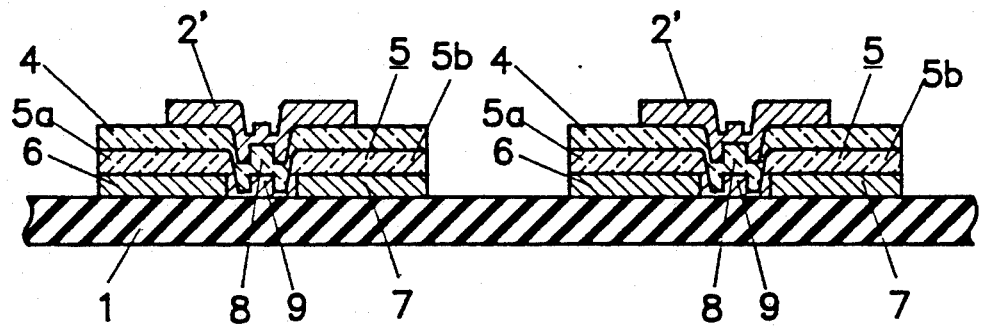
Figure 31:
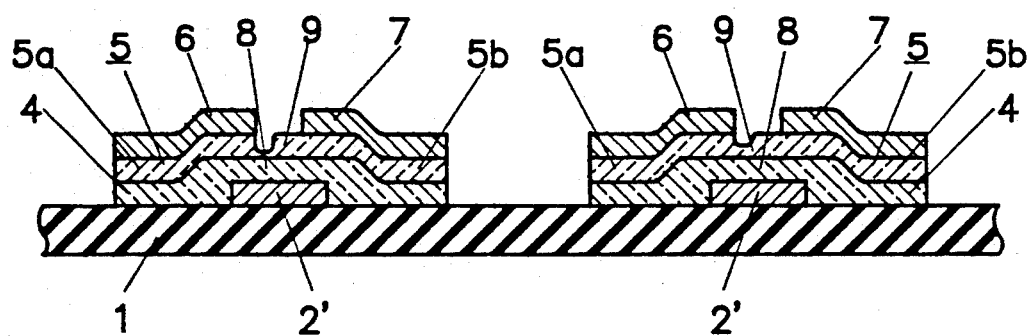
Figure 32:
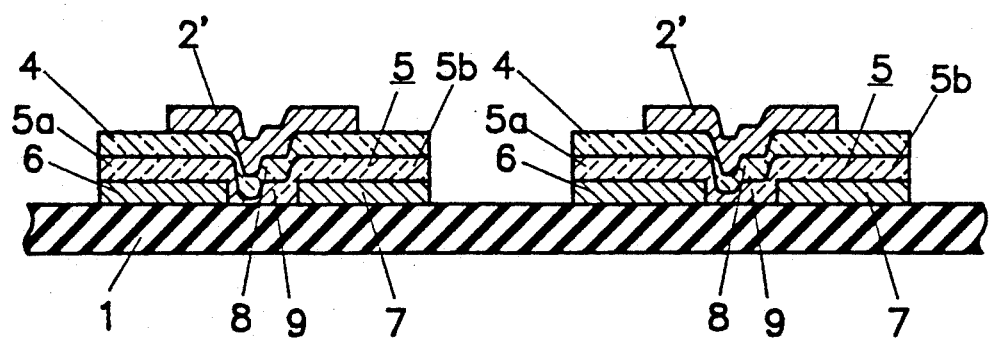

Sixteenth Embodiment (FIG. 16)

FIG. 16 shows two thin film FETs embodying the present invention formed on a substrate 1. Basically, these thin film FETs are the same in construction as those shown in FIG. 14, except that the thin film FETs shown in FIG. 16 each have a third semiconductor layer 10 formed only in a gap between a source electrode 6 and a drain electrode 7 formed on the substrate. In these thin film FETs shown in FIG. 16, the thickness, of the third semiconductor layer 10 of one of the third semiconductor layers 10 is greater than that of the other, so that the thin film FETs are different from each other in gate threshold voltage $V_{th}$.

Seventeenth to Twentieth Embodiments (FIG. 17 to 20)

In thin film FETs shown in FIGS. 17 to 20, intermediate semiconductor layers 9 are etched partly (FIGS. 17, 18 and 19) or by locally different depths so that the thickness of the intermediate semiconductor layers 9 depends on the location. In the thin film FETs shown in FIGS. 17 and 18 the thickness of the central portion of the intermediate semiconductor layer 9 is greater than that of the side portions. In the thin film FETs shown in FIGS. 19 and 20, the thickness of one side portion of the intermediate semiconductor layer 9 is greater than that of the other side portion. The thickness of the intermediate semiconductor layer 9 need not be uniform with respect to the direction of the width or length of the channel 8; it is satisfactory if only a portion of the intermediate semiconductor layer 9 has a predetermined thickness.

The thin film FETs shown in FIG. 1 to 20 are MISFETs in technical parlance each having the gate electrode 2 joined through the gate insulating layer 3 to the first semiconductor layer 4. Shown in FIG. 21 to 34 are JFETs (junction field effect transistors) each having a gate 2' directly jointed to a first semiconductor layer 4 without using any gate insulating layer 3. These JFETs are substantially the same in construction as the MISFETs shown in FIG. 1 to 20, except that the JFETs shown in FIGS. 21 to 34 are not provided with any gate insulating layer 3.

In the foregoing thin film FETs, the substrate 1 has flat surfaces and is formed of a material having sufficient heat resistance and stable properties, and capable of allowing semiconductor films and insulating films to adhere thereto by adhesion, such as quartz glass, alumina, borosilicate glass, barium borosilicate glass, c-Si, a stainless steel, polyimide, Ta, Ni or Cr. When the source electrode 6 and the drain electrode 7 are formed on the substrate 1 as in the thin film FETs of FIGS. 4, 5 and 6, the substrate 1 must be a plate formed of an insulating material or a plate formed of a conductive material and having a surface coated with an insulating film.

The gate electrode 2 is formed of a conductive metal, such as Ni, Mg, Cr, a Cr-Ag alloy, a Cr-Au alloy, ITO, $SnO_2$, ZnO, a stainless steel, n+-type Si or p+-type Si. When the substrate 1 is formed of a conductive material, the substrate 1 may serve also as the gate electrode 2. The gate insulating layer 3 in contact with the gate electrode 2 is formed of an amorphous material having a small charge density and a high insulation performance, such as $SiO_x$, $SiN_x$, $SiO_xN_y$ or $TiO_2$. When the gate electrode 2 is formed of c-Si, a film of $SiO_2$ formed by thermal oxidation is used as the gate insulating layer 3. When the gate electrode 2 is formed of Ta or Ti, a film of $TiO_2$ or $Ta_2O_5$ formed by anodic oxidation, or a composite film, including such an insulating film is used as the gate insulating layer 3. The gate layer 2 of the JFET is a film of a conductive material capable of forming a barrier with the first semiconductor layer 4, for example, a metal which forms a Schottky barrier with the first semiconductor layer 4, such as Ni, Cr or Al, a semiconductor which forms a hetero junction with the first semiconductor layer 4, such as $SnO_2$, ITO or ZnO or a semiconductor which forms a pn junction with the first semiconductor layer 4, such as a p-type semiconductor or an n-type semiconductor, or a multilayer film of those semiconductors and conductive materials.

Generally, the first semiconductor layer 4, the second semiconductor layer 5 (5a and 5b), the intermediate semiconductor layer 9 and the third semiconductor layer 10 are thin films, preferably, thin crystalline films or thin amorphous films, of Si, Ge, SiC, Se or Te. Impurities added to the second semiconductor layer 5 (5a and 5b), the intermediate semiconductor layer 9 and the third semiconductor layer 10 for doping are selected taking into consideration the doping effect of the impurities in combination with the materials forming those layers. For example, P, B, Al, As, Ga, Sb are suitable impurities for doping amorphous Si semiconductor layers and amorphous Ge semiconductor layers, and P, Cl and I are suitable impurities for doping amorphous Se semiconductor layers and amorphous Te semiconductor layers.

The source electrode 6 and the drain electrode 7 are formed of a conductive material capable being in ohmic contact with the doped spaced apart second semiconductor layers 5a and 5b. Generally, Ni, Mg, Cr-Ag, Cr, Cr-Au, ITO, $SnO_2$, ZnO, stainless steels, n+-type Si and p+-type are used for forming the source electrode 6 and the drain electrode 7.

The gate electrode 2, the source electrode 6 and the drain electrode 7 are formed, for example, by a vacuum evaporation process or a sputtering process. The gate insulating layer 3 is formed, for example, by a CVD process, a vacuum evaporation process, an anodic oxidation process or a thermal oxidation process. The first semiconductor layer 4 and the second semiconductor layer 5 (5a and 5b) are formed, for example, by a CVD process or a vacuum evaporation process. The component films of the thin film FETs are patterned by a photolithographic process or a metal mask. The second semiconductor layer 5 (5a and 5b) is etched by an etching process capable of uniformly etching the second semiconductor layer 5 without damaging the underlying layer, such as a dry etching process or a wet etching process.

Examples of the thin film FETs of the present invention will be described hereinafter.

EXAMPLE 1

Thin film FETs as shown in FIG. 1 were fabricated. In fabricating each thin film FET, a gate electrode 2 was formed by depositing Cr in a film of 300Å over a glass substrate 1 by vacuum evaporation and patterning the Cr film. Then, an amorphous $SiO_x$ film of 1350Å in thickness as a gate insulating layer 3 was formed over the surface of the substrate 1 provided with the gate electrode 2 by plasma CVD process. An amorphous i-Si:H film of 500Å in thickness as a first semiconductor layer 4 was formed by a plasma CVD process over the gate insulating layer 3, and then an amorphous n+-Si:H film of 500Å was formed as a second semiconductor layer 5 over the first semiconductor layer 4 by a plasma CVD process using $SiH_4$ mixed with $PH_3$ as source gas. A Cr film of 300Å in thickness was formed as a source electrode 6 and a drain electrode 7 by a vacuum evaporation process using a mask. A channel of 200 μm in length and 6000 μm in width was formed between the source electrode 6 and the drain electrode 7.

Then, a portion of the second semiconductor layer 5 corresponding to a gap between the source electrode 6 and the drain electrode 7, namely, a portion of the second semiconductor layer 5 in contact with the channel 8 of the first semiconductor layer 4, was etched using the source electrode 6 and the drain electrode 7 as masks by a plasma etching process to a depth in the range of 0 to 500Å to form an intermediate semiconductor layer 9.

Then, the source electrode 6, the drain electrode 7 and the space between the source electrode 6 and the drain electrode 7 were coated with a resist film, and portions of the first semiconductor layer 4 and the second semiconductor layer 5 not coated with the resist film were removed by a plasma etching process.

Thus, thin film FETs as shown in FIG. 1 were completed. The thin film FETs had intermediate semiconductor layers 9 different from each other in thickness, respectively.

Figure 33:
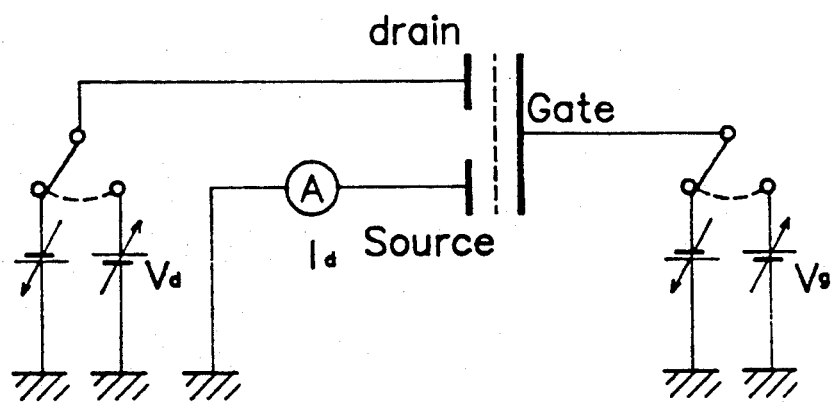
FIG. 33 is a circuit diagram of an electric circuit for measuring the gate threshold voltages of the thin film FETs of FIG. 1 to 32.
Figure 35:
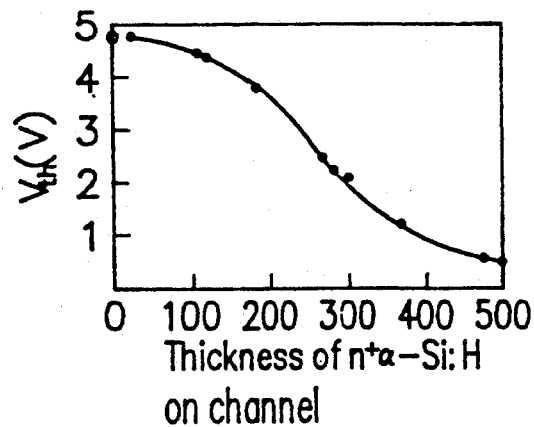
FIG. 35 is a graph showing an example of the relation between the gate threshold voltage and the thickness of an intermediate semiconductor layer.
Figure 36:
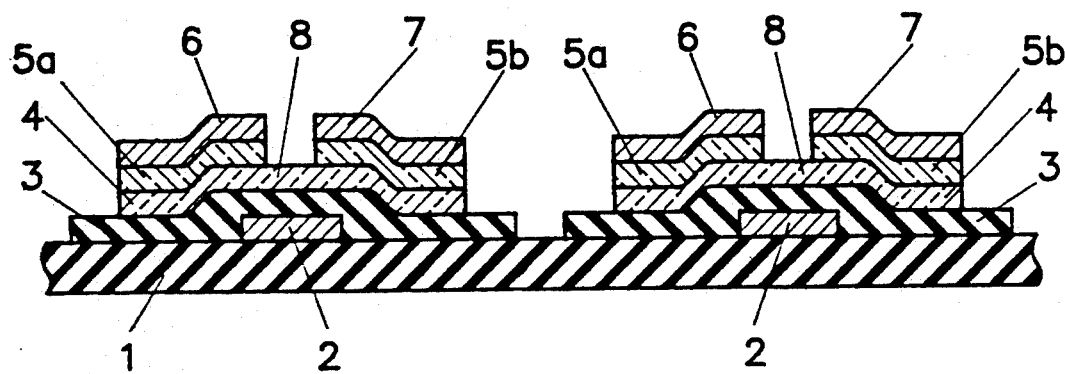
FIGS. 36 and 37 are schematic sectional views showing the structures of conventional thin film FETs.

Drain currents $I_d$ for various levels of drain voltage $V_d$ and gate voltage $V_g$ of the thin film FETs were measured by a measuring circuit as shown in FIG. 33. Measured results for those thin film FETs are shown in the graph of FIG. 36, in which gate voltage $V_g$ is measured on the horizontal axis, and $dI_d/dV_d$, namely, the derivative of $I_d$ for the drain voltage $V_d$ infinitely close to zero with respect to drain voltage $V_d$, is measured on the vertical axis. Intercepts of the curves on the horizontal axis are the gate threshold voltages $V_{th}$ of the thin film FETs. FIG. 35 shows the relation between the gate threshold voltage $V_{th}$ thus determined and the thickness of the intermediate semiconductor layer 9.

Figure 34:
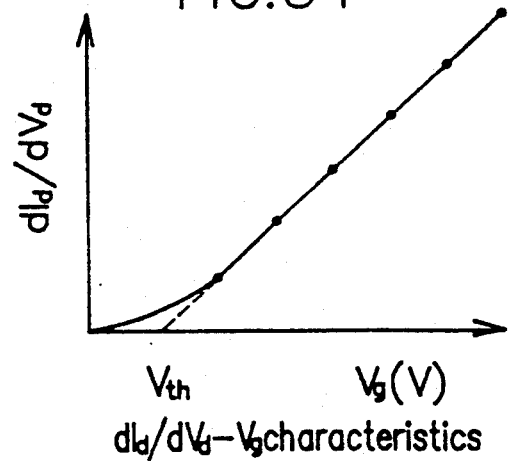
FIG. 34 is a graph showing an example of $dI_d/dV_d$-to-$V_g$ characteristics measured by the electric circuit of FIG. 33.

As is obvious from FIGS. 34 and 35, the gate threshold voltage $V_{th}$ is dependent on the thickness of the intermediate semiconductor layer 9.

The variation of the gate threshold voltage $V_{th}$ with the thickness of the intermediate semiconductor layer 9 decreases when the thickness of the intermediate semiconductor layer 9 exceeds $X_m$ expressed by:

$$X_m = \{2\epsilon \Delta V/(q(N_{DE}+N_E))\}^{\frac{1}{2}}$$

where $\epsilon$ is the dielectric constant of the semiconductor, $\Delta V$ is the variation of the potential of the intermediate semiconductor layer 9, q is unit charge of an electron, $N_{DE}$ is the concentration of active impurity in the intermediate semiconductor layer 9, and $N_E$ is the equivalent charged state density of the intermediate semiconductor layer 9.

The gate threshold voltage $V_{th}$ of a thin film FET not having the intermediate semiconductor layer 9, namely, a thin film FET in which an inner portion of the second semiconductor layer 5 formed of n+-Si:H corresponding to the gap between the source electrode 6 and the drain electrode 7 is removed completely by etching, was measured for comparison. A circle on the vertical axis of the graph shown in FIG. 35 is the gate threshold voltage $V_{th}$ of such a thin film FET.

EXAMPLE 2

A thin film FET was fabricated by processes similar to those employed in fabricating the thin film FET in Example 1. The thin film FET in Example 2 is substantially the same in construction as the thin film FET in Example 1, except that a film of amorphous p+-Si:H of 500Å in thickness formed by a plasma CVD was used as the second semiconductor layer 5 instead of the film of n+-Si:H film.

The gate threshold voltage $V_{th}$ of this thin film FET increases with the thickness of the intermediate semiconductor layer 9 formed between the spaced apart second semiconductor layers 5a and 5b along a curve reverse to the curve shown in FIG. 35.

EXAMPLE 3

Thin film FETs as shown in FIG. 4 were fabricated. A Cr film of 300Å in thickness was formed over a glass substrate 1 by vacuum evaporation, and then the Cr film was patterned to form source electrodes 6 and drain electrodes 7 each of 200 μm in channel length and 6000 μm in channel width. An amorphous n+-Si:H film of 500Å in thickness as a second semiconductor layer 5 was formed by a plasma CVD process over the surface of the substrate 1 having the source electrodes 6 and the drain electrodes 7. Portions of the second semiconductor layer 5 corresponding to the underlying source electrodes 6 and the drain electrodes 7 were coated by a first resist film, and then portions of the second semiconductor layer 5 not coated with the first resist film, namely, inner portions corresponding to gaps between the source electrodes 6 and the associated drain electrode 7, were etched by a plasma etching process respectively to different depths to form intermediate semiconductor layers 9 having different film thicknesses in the range of 0 to 500Å. After removing the resist film and etching slightly the surface of the second semiconductor layer 5, an amorphous i-Si:H film of 500Å in thickness was formed by a plasma CVD process as a first semiconductor layer 4. Portions of the first semiconductor layer 4 corresponding to the underlying source electrodes 6, the drain electrodes 7 and the intermediate semiconductor layers 9 were coated with a resist film, the amorphous n+-Si:H film and the amorphous i-Si:H film in the rest of portions were removed, and then the resist film was removed. Then, after surface cleaning, an amorphous SiO$_x$ film of 1350Å in thickness as a gate insulating layer 3 was formed by a plasma CVD process, and then a Cr film of 300Å in thickness as gate electrodes 2 was formed by vacuum evaporation using a mask. The respective intermediate semiconductor layers 9 of the thin film FETs thus fabricated have different thickness in the range of 0 to 500Å, respectively.

The characteristics of these thin film FETs were similar to those of the thin film FETs of Example 1.

EXAMPLE 4

Thin film FETs of Example 4 are the same as those of Example 1, except that Example 4 employs an amorphous p+-Si:H film of 500Å in thickness formed by a plasma CVD process as a doped third semiconductor layer instead of the amorphous n+-Si:H film employed in Example 1.

Figure 37:
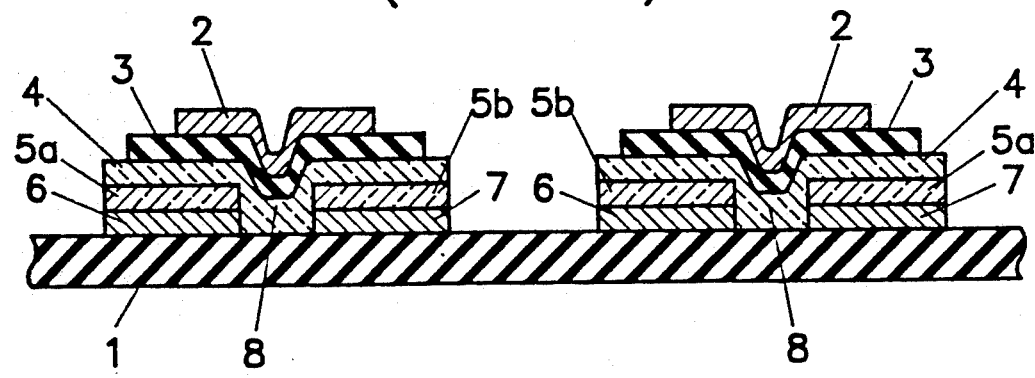

The gate threshold voltage $V_{th}$ of the thin film FETs increases with the thickness of the intermediate semiconductor layer 9 along a curve reverse to that shown in FIG. 37.

EXAMPLE 5

Thin film FETs of a construction as shown in FIG. 13 were fabricated. The thin film FETs of Example 5 are similar in construction to those of Example 1 shown in FIG. 1, except that inner portions of the second semiconductor layer 5 formed of an n-type semiconductor, corresponding to gaps between the adjacent source electrodes 6 and the associated drain electrodes 7 and in contact with channels 8 were removed completely by etching to form gaps, and then amorphous p+-Si:H films respectively of thicknesses in the range of 0 to 500Å as third semiconductor layers 10 were formed respectively in the gaps by a plasma CVD process using a metal mask. Portions of the third semiconductor layers 10 in contact with the channels 8 are intermediate semiconductor layers 9.

The gate threshold voltage $V_{th}$ of the thin film FETs increases with the thickness of the intermediate semiconductor layer 9 in contact with the channel 8 along a curve reverse to that shown in FIG. 37.

EXAMPLE 6

Thin film FETs of a construction as shown in FIG. 15 were fabricated. The thin film FETs of Example 6 are similar in construction to those of Example 1, except that inner portions of the second semiconductor layer 5 formed of a p-type semiconductor, corresponding to gaps between the source electrodes 6 and the associated drain electrodes 7 and in contact with channels 8 were removed completely by etching to form gaps, and then amorphous p+-Si:H films respectively of thicknesses in the range of 0 to 500Å as third semiconductor layers 10 were formed respectively in the gaps by a plasma CVD process using a metal mask. Portions of the third semiconductor layers 10 in contact with the channels 8 are intermediate semiconductor layers The gate threshold voltage $V_{th}$ of the thin film FETs increases with the thickness of the intermediate semiconductor layer 9 in contact with the channel 8 along a curve reverse to that shown in FIG. 37.

EXAMPLE 7

Thin film FETs of a construction as shown in FIG. 13 were fabricated. The thin film FETs of Example 7 are similar in construction to those of Example 1, except that inner portions of the second semiconductor layer 5 formed of an n-type semiconductor, corresponding to gaps between the source electrodes 6 and the associated drain electrodes 7 and in contact with channels 8 were removed completely by etching to form gaps, and then amorphous n+-Si:H films, respectively of thicknesses in the range of 0 to 500Å as third semiconductor layers 10, were formed respectively in the gaps by a plasma CVD process using a metal mask. Portions of the third semiconductor layers 10 in contact with the channels 8 are intermediate semiconductor layers 9.

The characteristics of these thin film FETs were similar to those of Example 1.

EXAMPLE 8

Thin film FETs of a construction as shown in FIG. 15 were fabricated. The thin film FETs of Example 8 are similar in construction to those of Example 2, except that inner portions of the second semiconductor layer 5 formed of a p-type semiconductor, corresponding to gaps between the source electrodes 6 and the associated drain electrodes 7 and in contact with channels 8 were removed completely by etching to form gaps, and then amorphous n+-Si:H films, respectively of thicknesses in the range of 0 to 500Å as third semiconductor layers 10 were formed respectively in the gaps by a plasma CVD process using a metal mask. Portions of the third semiconductor layers 10 in contact with the channels 8 are intermediate semiconductor layers 9.

The characteristics of these thin film FETs were similar to those of Example 1.

EXAMPLE 9

Thin film FETs of a construction as shown in FIG. 14 were fabricated. Amorphous p+-Si:H films respectively of thicknesses in the range of 0 to 500Å were formed on a glass substrate 1 by a plasma CVD process, and then the amorphous p.-Si:H films were patterned to form third semiconductor layers 10. A Cr film of 300Å in thickness was formed over the substrate 1 including the third semiconductor layers 10, and then the Cr film was etched to form a source electrode 6 and a drain electrode 7 on opposite sides of each third semiconductor layer 10 with a gap therebetween. Then spaced apart second semiconductor layer portions 5a and 5b of 200 μm in separation and 6000 μm in width were formed by forming an amorphous n+-Si:H film of 500Å in thickness by a plasma CVD process and patterning the amorphous n+-Si:H film. Subsequently, first semiconductor layers 4, gate insulating layers 3 and gate electrodes 2 were formed in that order.

The gate threshold voltage $V_{th}$ of the thin film FETs of Example 9 increases with the thickness of the intermediate semiconductor layer 9 in contact with the channel 8 along a curve reverse to that shown in FIG. 37.

EXAMPLE 10

Thin film FETs of a construction as shown in FIG. 14 were fabricated. Amorphous p+-Si:H films respectively of thicknesses in the range of 0 to 500Å were formed on a glass substrate 1 by a plasma CVD process, and then the amorphous p+-Si:H films were patterned to form third semiconductor layers 10. A Cr film of 300Å in thickness was formed over the substrate 1 including the third semiconductor layer 10, and then the Cr film was etched to form a source electrode 6 and a drain electrode 7 on opposite sides of each third semiconductor layer 10 with a gap therebetween. Then, spaced apart second semiconductor layer portions 5a and 5b of 200 μm in separation and 6000 μm in width were formed by forming an amorphous p+-Si:H film of 500Å in thickness by a plasma CVD process and patterning the amorphous p+-Si:H film. Subsequently, first semiconductor layers 4, gate insulating layers 3 and gate electrodes 2 were formed in that order.

The threshold voltage $V_{th}$ of the thin film FETs of Example 10 increases with the thickness of the intermediate semiconductor layer 9 in contact with the channel 8 along a curve reverse to that shown in FIG. 37.

EXAMPLE 11

Thin film FETs of a construction as shown in FIG. 16 were fabricated. Amorphous n+-Si:H films respectively of thicknesses in the range of 0 to 500Å were formed on a glass substrate 1 by a plasma CVD process, and then the amorphous n+-Si:H films were patterned to form third semiconductor layers 10. A Cr film of 300Å in thickness was formed over the substrate 1 including the third semiconductor layers 10, and then the Cr film was etched to form a source electrode 6 and a drain electrode 7 on opposite sides of each third semiconductor layer 10 with a gap therebetween. Then, spaced apart second semiconductor layer portions 5a and 5b of 200 μm in separation and 6000 μm in width were formed by forming an amorphous n+-Si:H film of 500Å in thickness by a plasma CVD process and patterning the amorphous n+-Si:H film. Subsequently, first semiconductor layers 4, gate insulating layers 3 and gate electrodes 2 were formed in that order.

The characteristics of the thin film FETs of Example 11 were similar to those of the Example 1.

EXAMPLE 12

Thin film FETs of a construction as shown in FIG. 16 were fabricated. Amorphous n+-Si:H films respectively of thicknesses in the range of 0 to 500Å were formed on a glass substrate 1 by a plasma CVD process, and then the amorphous n+-Si:H films were patterned to form third semiconductor layers 10. A Cr film of 300Å in thickness was formed over the substrate 1 including the third semiconductor layers 10, and then the Cr film was etched to form a source electrode 6 and a drain electrode 7 on opposite sides of each third semiconductor layer 10 with a gap therebetween. Then, spaced apart second semiconductor layer portions 5a and 5b of 200 μm in separation and 6000 m in width were formed by forming an amorphous p+-Si:H film of 500Å in thickness by a plasma CVD process and patterning the amorphous p+-Si:H film. Subsequently, first semiconductor layers 4, gate insulating layers 3 and gate electrodes 2 were formed in that order.

The characteristics of the thin film FETs of Example 12 were similar to those of thin film FETs of Example 1.

EXAMPLE 13

Thin film FETs respectively having constructions as shown in FIGS. 21 to 32 were fabricated, in which the gate insulating layers 3 of the thin film FETs of Examples 1 to 12 were omitted, and the gate 2' for forming a barrier were formed in contact with the first semiconductor layers 4, respectively.

The characteristics of the thin film FETs of Example 13 as shown in FIGS. 21 to 32 were similar to those of the thin film FETs of Examples 1 to 12, respectively.

Although the invention has been described in its preferred forms with a certain degree of particularity, obviously many changes and variations are possible therein. It is therefore understood that the present invention may be practiced otherwise than specifically described herein without departing from the scope and spirit thereof.

What is claimed is:

1. A thin film field effect transistor comprising: a source electrode; a drain electrode separated from said source electrode by a gap; a first semiconductor layer; a doped second semiconductor layer distinct from said first semiconductor layer and having first and second portions, said first portion of said doped second semiconductor layer being provided between said first semiconductor layer and said source electrode and said second portion of said doped second semiconductor layer being provided between said first semiconductor layer and said drain electrode; a gate electrode; a gate insulating layer which contacts said gate electrode is provided between said gate electrode and a first surface of said first semiconductor layer at a location above said gap; and a doped intermediate layer distinct from said first and doped second semiconductor layers and extending between said first and second portions of said doped second semiconductor layer and positioned within said gap, said doped intermediate layer contacting a second surface of said first semiconductor layer at a channel portion thereof.

2. A thin film field effect transistor according to claim 1, wherein said intermediate layer is formed of a semiconductor containing an impurity of a conduction type the same as that of an impurity contained in said second semiconductor layer.

3. A thin film field effect transistor according to claim 1, wherein said intermediate layer is formed of a semiconductor containing an impurity of a conduction type different from that of an impurity contained in said second semiconductor layer.

4. A thin film field effect transistor according to claim 1, wherein said intermediate layer is in contact at least with one of said first and second portions of said second semiconductor layer.

5. A thin film field effect transistor according to claim 1, wherein said intermediate layer is not in contact with said first and second portions of said second semiconductor layer.

6. A thin field effect transistor according to claim 1, wherein said doped intermediate layer is a portion of a third semiconductor layer.

7. A thin film field effect transistor comprising: a source electrode; a drain electrode separated from said source electrode by a gap, a first semiconductor layer having a channel portion contained within said gap; a doped second semiconductor layer distinct from said first semiconductor layer and having first and second portions, said first portion of said doped second semiconductor layer being provided between said first semiconductor layer and said source electrode and said second portion of said second semiconductor layer being provided between said first semiconductor layer and said drain electrode; a gate electrode; a gate insulating layer which contacts said gate electrode is provided between said gate electrode and a first surface of said first semiconductor layer at a location above said gap; and a doped intermediate layer distinct from said first and doped second semiconductor layers and contacting said channel portion at a second surface of said first semiconductor layer.

8. A thin film field effect transistor according to claim 7, wherein said doped intermediate layer is a portion of a third semiconductor layer which contacts said source and drain electrodes at lower surfaces thereof.

9. A thin film field effect transistor comprising: a source electrode; a drain electrode separated from said source electrode by a gap; a first semiconductor layer; a doped second semiconductor layer distinct from said first semiconductor layer and having first and second portions, said first portion of said doped second semiconductor layer being provided between said source electrode and said first semiconductor layer and said second portion of said doped second semiconductor layer being provided between said drain electrode and said first semiconductor layer; a gate contacting a first surface of said first semiconductor layer at a location underneath said gap; and a doped intermediate layer distinct from said first and doped second semiconductor layers and provided between said first and second portions of said doped second semiconductor layer, said doped intermediate layer contacting a second surface of said first semiconductor layer at a channel portion thereof.

10. A thin film field effect transistor comprising: a source electrode; a drain electrode separated from said source electrode by a gap; a first semiconductor layer; a doped second semiconductor layer distinct from said first semiconductor layer and having first and second portions, said first portion of said doped second semiconductor layer being provided between said first semiconductor and said source electrode and said second portion of said doped second semiconductor layer being provided between said first semiconductor layer and said drain electrode; a gate contacting a first surface of said first semiconductor layer at a location above said gap; and a doped intermediate layer distinct from said first and doped second semiconductor layers and extending between said first and second portions of said doped second semiconductor layer and positioned within said gap, said doped intermediate layer contacting a second surface of said first semiconductor layer at a channel portion thereof.

11. A thin film effect transistor according to claim 10, wherein said doped intermediate layer is a portion of a third semiconductor layer.

12. A thin film field effect transistor comprising: a source electrode; a drain electrode separated from said source electrode by a gap, a first semiconductor layer having a channel portion contained within said gap; a doped second semiconductor layer distinct from said first semiconductor layer and having first and second portions, said first portion of said doped second semiconductor layer and said source electrode and said first semiconductor layer and said source electrode and said second portion of said second semiconductor layer being provided between said first semiconductor layer and said drain electrode; a gate contacting a first surface of said first semiconductor layer at a location above said gap; and a doped intermediate layer distinct from said first and doped second semiconductor layers and contacting said channel portion at a second surface of said first semiconductor layer.

* * * * *

UNITED STATES PATENT AND TRADEMARK OFFICE
CERTIFICATE OF CORRECTION

PATENT NO.   : 5 075 746
DATED        : December 24, 1991
INVENTOR(S)  : Yutaka HAYASHI et al It is certified that error appears in the above-identified patent and that said Letters Patent is hereby corrected as shown below:

Column 16, lines 30-31; change "and said source electrode and said first semiconductor layer and said source electrode and" to ---being provided between said first semiconductor layer and said source electrode and---.

Signed and Sealed this

Twenty-fifth Day of May, 1993

Attest:

MICHAEL K. KIRK

Attesting Officer        Acting Commissioner of Patents and Trademarks